(12) United States Patent
Cheng et al.

(10) Patent No.: US 8,872,172 B2
(45) Date of Patent: Oct. 28, 2014

(54) EMBEDDED SOURCE/DRAINS WITH EPITAXIAL OXIDE UNDERLAYER

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Raghavasimhan Sreenivasan, Schenectady, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/652,521

(22) Filed: Oct. 16, 2012

(65) Prior Publication Data

US 2014/0103331 A1 Apr. 17, 2014

(51) Int. Cl.
*H01L 29/78* (2006.01)

(52) U.S. Cl.
USPC ............. 257/43; 438/285; 438/479; 438/286; 438/272; 438/386

(58) Field of Classification Search
USPC ........................ 257/43, 266, 288, 192, E21.09
See application file for complete search history.

(56) References Cited

U.S. PATENT DOCUMENTS

| | | | |
|---|---|---|---|
| 6,610,548 B1 | 8/2003 | Ami et al. | |
| 6,852,575 B2 | 2/2005 | Bojarczuk, Jr. et al. | |
| 7,364,989 B2 | 4/2008 | Tweet et al. | |
| 7,446,005 B2 | 11/2008 | Messenger et al. | |
| 7,544,997 B2 | 6/2009 | Zhang et al. | |
| 8,017,487 B2 | 9/2011 | Chong et al. | |
| 8,106,381 B2 | 1/2012 | Atanackovic | |
| 8,154,084 B2 | 4/2012 | Hoentschel et al. | |
| 2006/0113603 A1 | 6/2006 | Currie | |
| 2009/0246921 A1* | 10/2009 | Cheng et al. ................ | 438/221 |
| 2012/0112288 A1* | 5/2012 | Luo et al. .................... | 257/368 |
| 2012/0138897 A1 | 6/2012 | Lin et al. | |
| 2012/0181625 A1* | 7/2012 | Kwok et al. ................. | 257/408 |
| 2012/0273886 A1* | 11/2012 | Zhong et al. ................ | 257/347 |
| 2013/0032877 A1* | 2/2013 | Ostermay et al. ........... | 257/329 |
| 2013/0207162 A1* | 8/2013 | Khakifirooz et al. ........ | 257/192 |

OTHER PUBLICATIONS

Disclosed Anonymously, "Method for Epitaxial Growth on Si", IP.com Electronic Publication: Dec. 21, 2011. IPCOM000213575D.

* cited by examiner

*Primary Examiner* — Chuong A Luu
*Assistant Examiner* — Rodolfo Fortich
(74) *Attorney, Agent, or Firm* — L. Jeffrey Kelly; Catherine Ivers

(57) ABSTRACT

Semiconductor structures having embedded source/drains with oxide underlayers and methods for forming the same. Embodiments include semiconductor structures having a channel in a substrate, and a source/drain region adjacent to the channel including an embedded oxide region and an embedded semiconductor region located above the embedded oxide region. Embodiments further include methods of forming a transistor structure including forming a gate on a substrate, etching a source/drain recess in the substrate, filling a bottom portion of the source/drain recess with an oxide layer, and filling a portion of the source/drain recess not filled by the oxide layer with a semiconductor layer.

17 Claims, 3 Drawing Sheets

EMBEDDED SOURCE/DRAINS WITH EPITAXIAL OXIDE UNDERLAYER

BACKGROUND

The present invention relates generally to microelectronic devices, and specifically to embedded silicon-germanium source/drains.

As transistor structures continue to become smaller in size, it may be advantageous to employ techniques that increase carrier mobility in the channel region of a transistor by generating strain in the channel and therefore increase device performance. In the case of field effect transistors (FETs), one such technique may be to embed material with a different lattice structure than the channel between the source/drain regions of the FETs, as depicted in FIG. 1. This causes the channel region to stretch or compress to match the atomic lattice of the source/drain regions. For p-type FETs (pFETs), i.e., FETs with p-type channels), this may be accomplished by using embedded silicon-germanium alloy source/drain regions and for n-type FETs (nFETs, i.e., FETs with n-type channels), this may be accomplished by using embedded silicon-carbon source/drain regions.

FIG. 1 depicts a known embodiment of a FET 10 fabricated on a semiconductor substrate 11. The substrate 11 may include isolation regions 12, and a gate 13 having spacers 14 on sidewalls of the gate 13. The location of the gate 13 defines a channel region 17 in the substrate 11. In order to apply stress to the channel region 17, embedded source/drain regions 15 made of a silicon-germanium alloy (for pFETs) or a silicon-carbon alloy (for nFETs) may be formed laterally adjacent to the channel region 17.

In some cases, particularly for deeper source/drain regions 15, "punchthrough" may occur. Punchthrough is when a path exists for parasitic current between the source and the drain other than the intended path through the channel 17. In the pFET 10, this path for punchthrough may occur in region 18. One method of preventing punchthrough is halo implantation, which involves sophisticated angled doping techniques to introduce dopants into the region 18 of the opposite type as in the source/drain regions 15. Because of the complicated nature of halo implantation, a method of fabricating embedded silicon-germanium source/drain regions capable of providing stress to the channel of a FET while reducing the effects of punchthrough without employing halo implantation is desirable.

BRIEF SUMMARY

The present invention relates to relates to semiconductor structure having embedded source/drains with epitaxial oxide underlayers and methods of forming said semiconductor structures. According to at least one exemplary embodiment, the semiconductor structure may include a transistor including a substrate, a channel region in the substrate and a source/drain region adjacent to the channel region including an embedded oxide region and an embedded semiconductor region located above the embedded oxide region.

Embodiments may further include methods of forming transistor structures having embedded source/drains with epitaxial oxide underlayers. The method may include forming a gate on a semiconductor substrate, etching a source/drain recess in the semiconductor substrate not under the gate, filling a bottom portion of the source/drain recess with an oxide layer, and filling a portion of the source/drain recess not filled by the oxide layer with a semiconductor layer.

Embodiments may further include methods of forming source/drain regions. The method may include selecting a desired amount of stress to be applied by the source/drain region, selecting a semiconductor material that will apply the desired amount of stress when formed in the source/drain region, selecting a oxide with a similar lattice constant as the semiconductor material, etching a source/drain recess having a top portion and a bottom portion in a substrate, epitaxially growing the oxide in the bottom portion of the source/drain recess, epitaxially growing the semiconductor material on the oxide at least partially in the top portion of the source/drain recess.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1:
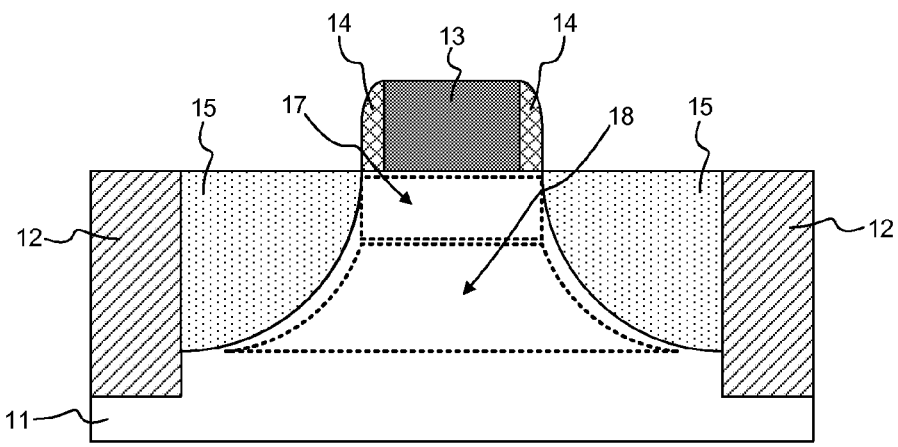
FIG. 1 depicts a typical transistor structure having embedded source/drain regions.
Figure 2:
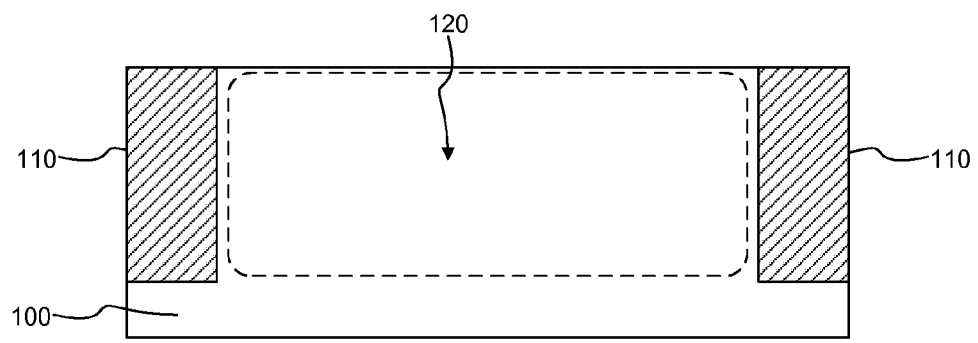
FIG. 2 depicts forming isolation regions and defining an active area between the isolation regions in a semiconductor substrate according to an embodiment of the present invention.

Referring to FIG. 2, isolation regions 110 may be formed in a semiconductor substrate 100 to isolate structures formed on the substrate 100 from adjacent structures. The substrate 100 may be made of any semiconductor material including, but not limited to: silicon, germanium, silicon-germanium alloy, carbon-doped silicon, carbon-doped silicon-germanium alloy (SiGe:C), and compound (e.g. III-V and II-VI) semiconductor materials. Non-limiting examples of compound semiconductor materials include gallium arsenide, indium arsenide, and indium phosphide. In some embodiments, the substrate 100 may further include a buried insulator layer (not shown) made of, for example, oxides, nitrides, oxynitrides of silicon, and combinations thereof. The buried insulator layer may improve device isolation and prevent dopant diffusion. Isolation regions 110 may be formed by any known method in the art, including, for example, etching into the substrate 100 to form trenches, and then filling the trenches with an insulating material, such as silicon dioxide. Other embodiments may include other means of isolating structures formed on the substrate 100, or may have isolation around none or only some structures. After forming isolation regions 110, an active region 120 in the substrate 100 is defined as the region between a pair of isolation regions 110. Active region 120 may include doped and undoped regions that have been omitted from FIG. 2 for illustrative clarity.

Figure 3:
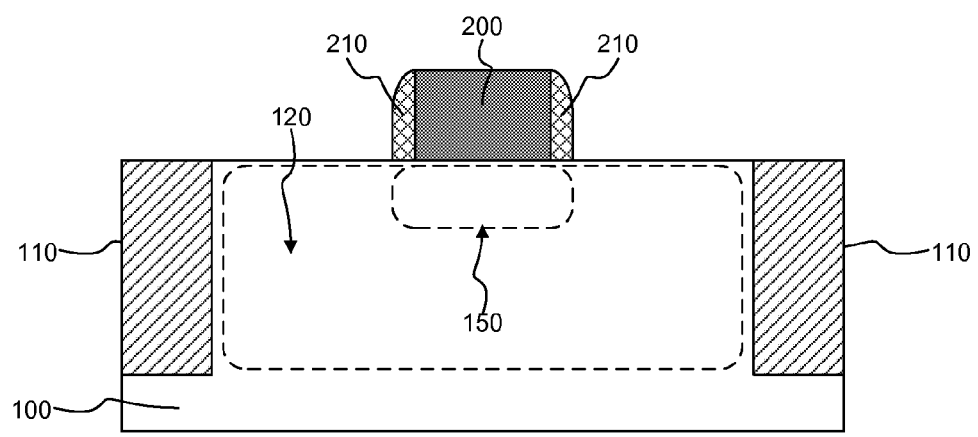
FIG. 3 depicts forming a gate and gate spacers above the active area of the semiconductor substrate according to an embodiment of the present invention.

Referring to FIG. 3, a gate 200 and spacers 210 are formed on the substrate 100 above the active region 120. The gate 200 may include a gate dielectric layer, a gate electrode, and a hard cap (not shown), and may be formed by any method known in the art, including depositing a stack of layers on the substrate 100, masking the stack of layers using photolithography, and etching to remove unwanted material from the stack of layers (not shown). In other embodiments where a gate-last process is used, the gate 200 may include a sacrificial layer that will later be removed and replaced with, for example, a replacement metal gate structure. Spacers 210 may be made of, for example, silicon nitride, silicon oxide, silicon oxynitrides, or a combination thereof, and may be formed by any method known in the art, including depositing a conformal silicon nitride layer over the gate 200 and etching to remove unwanted material from the conformal silicon nitride layer (not shown). The area of the active region 120 directly below the gate 200 may be referred to as the channel region 150. The placement of the gate 200 above the active region 120 defines a channel region 150 in the active region 120, such that the channel region 150 is within the substrate 100 below the gate 200. In some embodiments, the vertical thickness of the channel region 150 may be about 5 nm to about 10 nm. The thickness of the channel region may be determined by the intended path that current is able to flow from the source to the drain under gate 200. In some embodiments, multiple gates may be formed above active region 120 when fabricating multiple transistor structures having shared/source drains (not shown).

Figure 4:
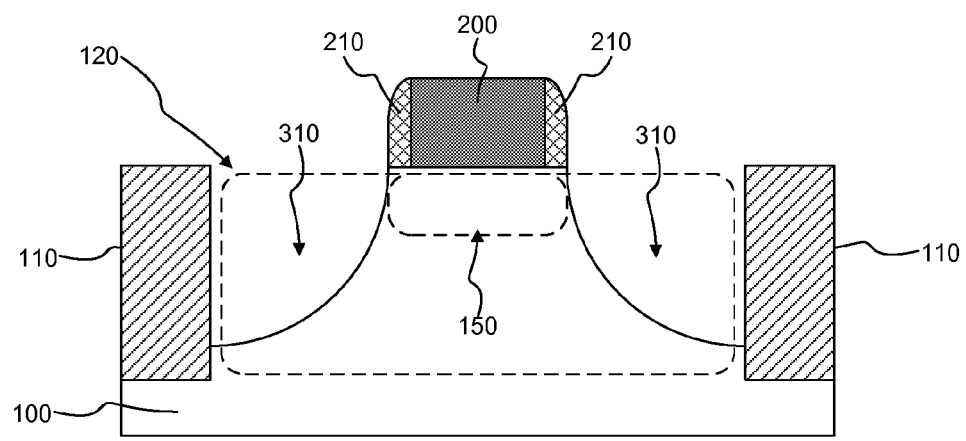
FIG. 4 depicts forming source/drain recess regions in the active area of the semiconductor substrate according to an embodiment of the present invention.

Referring to FIG. 4, source/drain recesses 310 are formed in the active region 120 of the substrate 100. Source/drain recesses 310 may be formed, for example, by etching the substrate 100 using a known etching process, such as reactive ion etching (RIE) or a wet chemical etching process. In some embodiments, the etching process may be self-aligned, using isolation regions 110 and spacers 210 to define the lateral bounds of each source/drain recess 310. In other embodiments, photolithography may be used to define the portion of the substrate 100 to be etched, in which case each source/drain recess 310 may not span the entire width of the substrate 100 between the respective isolation region 110 and the spacer 210. The etching process used to form source/drain recesses 310 may not remove any portion of the substrate 100 in the channel region 150. While source/drain recesses 310 are depicted as having a curved shape, source/drain recesses 310 may be formed in any shape known in the art, including recesses having substantially vertical sidewalls and the commonly-used sigma shape. In some embodiments, source/drain recesses 310 may have a maximum depth of about 80 nm to 100 nm. By etching deeper source/drain recesses 310, it may be possible to apply greater stress to the channel region 150 when material of a greater or lesser lattice constant than substrate 100 is formed in source/drain recesses 310. In some embodiments, source/drain recesses 310 may not have a depth greater than the depth of isolation regions 110.

Figure 5:
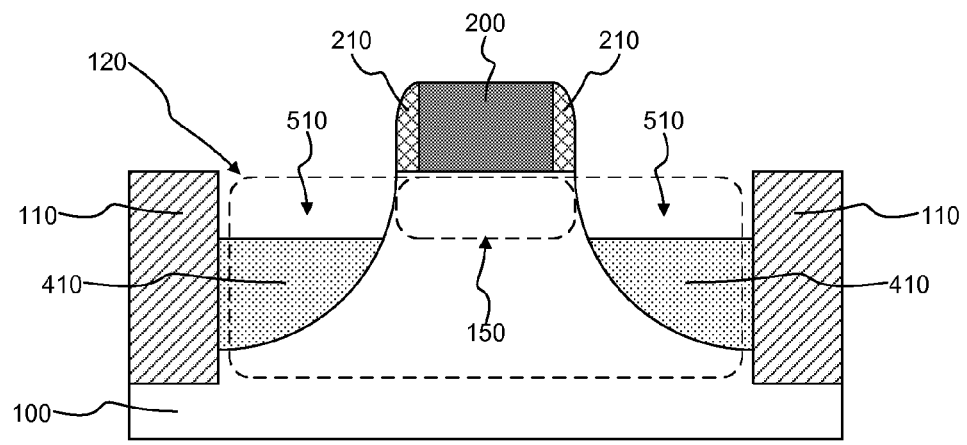
FIG. 5 depicts filling bottom portions of the source/drain recess regions with an epitaxially grown oxide according to an embodiment of the present invention.

Referring to FIG. 5, embedded oxide regions 410 may be formed in a bottom portion of source/drain recesses 310 (FIG. 4). Embedded oxide regions 410 may fill only a portion of source/drain recesses 310, so that top portions 510 of source/drain recesses 310 remain unfilled. In some embodiments, top portions 510 may have a depth of about 5 nm to about 10 nm (i.e. substantially equal to the vertical thickness of the channel region 150). In embodiments where the source/drain recesses 310 have depth of about 80 nm to about 100 nm, embedded oxide regions 410 may therefore have a thickness of 70 nm to 95 nm. In other embodiments top portions 510 may have a depth greater than or less than the vertical thickness of channel region 150. Embedded oxide regions 410 may be formed by epitaxially growing a rare-earth oxide in a bottom portion of source/drain recesses 310. For pFETs, embedded oxide regions 410 may be made of cerium oxide (CeO2). For nFETs, embedded oxide regions 410 may be made of scandium oxide ($Sc_2O_3$). Other known suitable rare earth oxides may include, for example, cadmium oxide ($Cd_2O_3$), yttrium oxide ($Y_2O_3$), scandium oxide ($Sc_2O_3$), lanthanum oxide ($La_2O_3$), praseodymium oxide ($Pr_2O_3$), thorium oxide ($ThO_2$), or actinium oxide ($Ac_2O_3$), or any combination thereof. However, other rare-earth oxide materials are explicitly contemplated. As discussed below, the particular oxide used for embedded oxide regions 410 will depend on the lattice structure of the embedded semiconductor regions 610 (FIG. 6) to be formed above embedded oxide regions 410. In some embodiments, the rare-earth oxide selected for embedded oxide regions 410 may be capable of supporting subsequent epitaxial growth of a silicon-germanium alloy on its top surface.

Figure 6:
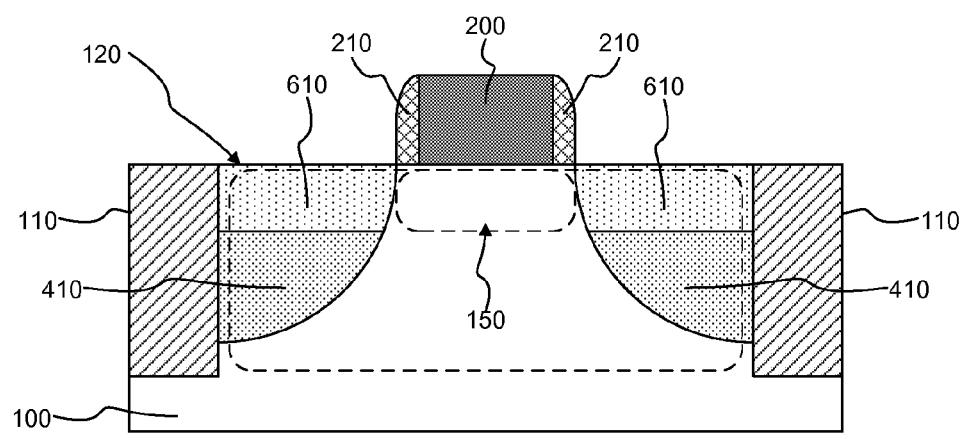
FIG. 6 depicts filling the top portions of the source/drain regions with a silicon-germanium alloy or a silicon-carbon alloy according to an embodiment of the present invention.

Referring to FIG. 6, embedded semiconductor regions 610 may be formed in top portions 510 on or above embedded oxide regions 410. Embedded semiconductor regions 610 may be made of, for example, either a silicon-germanium alloy (in the case of pFETs) or a silicon-carbon alloy (in the case of nFETs). Embedded semiconductor regions 610 may be formed by growing, for example, epitaxial silicon-germanium or epitaxial silicon-carbon on embedded oxide regions 410. In some embodiments, the germanium content of embedded semiconductor regions 610 may range from about 20% to about 50%. Embodiments where the germanium content of embedded semiconductor regions 610 is less than 20% or greater than 50% are explicitly contemplated. In other embodiments, the carbon content of embedded semiconductor regions 610 may range from about 0.5% to about 2%. Embodiments where the carbon content of embedded semiconductor regions 610 is less than 0.5% or greater than 2% are explicitly contemplated. In some embodiments, embedded semiconductor regions 610 will be substantially flush with the top surface of substrate 100, as depicted. As top portions 510 may have a thickness of about 5 nm to about 10 nm, embedded semiconductor regions 610 may also have a thickness within the substrate 100 of about 5 nm to about 10 nm. In other embodiments, embedded semiconductor regions 610 may extend above the top surface of the substrate 100 to incorporate raised source/drain (RSD) techniques. Where raised/source drains are used, embedded semiconductor regions 610 may extend above the top surface of substrate 100. In some embodiments, embedded semiconductor regions 610 may be doped via either ion implantation or in-situ doping.

Figure 7:
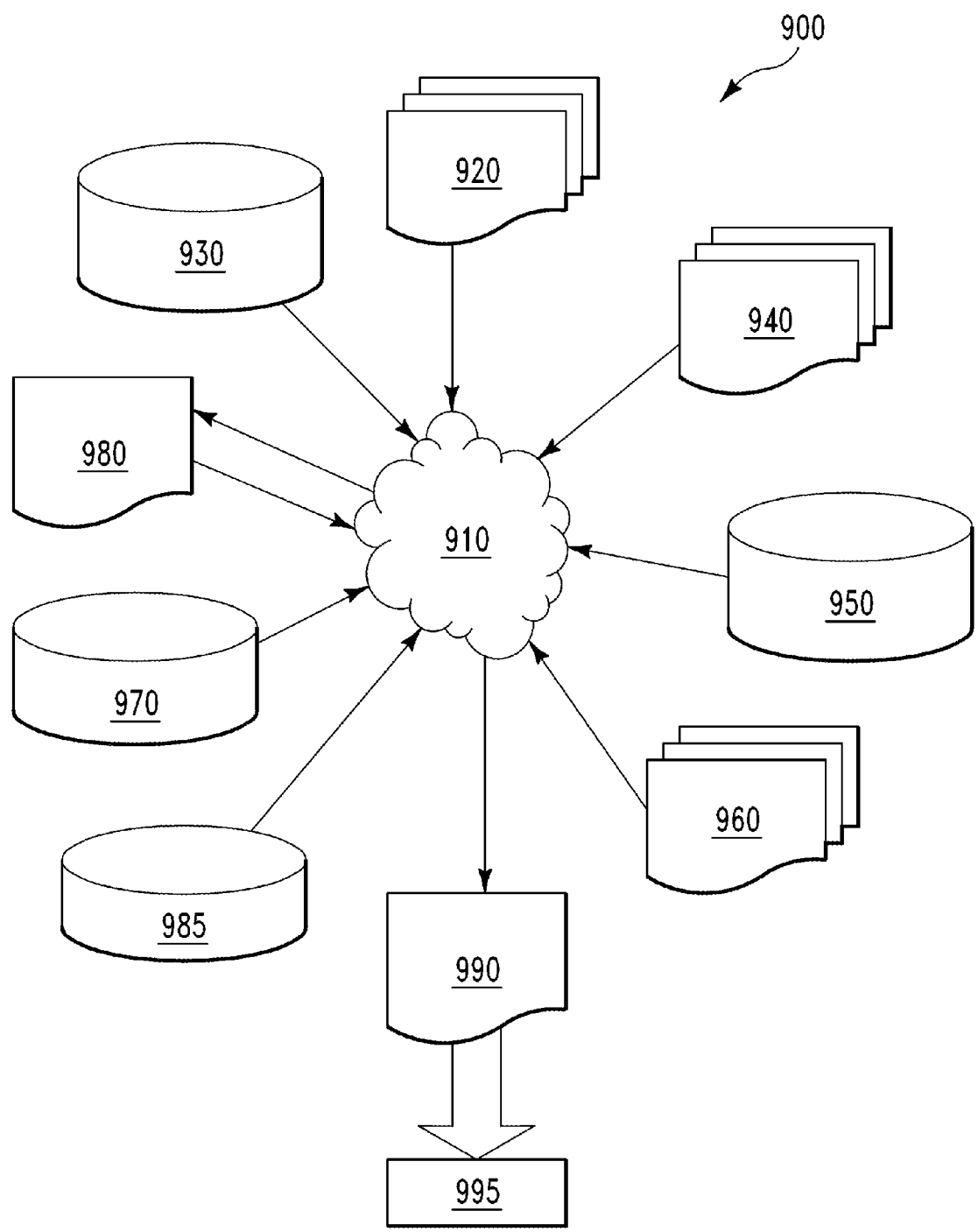
FIG. 7 is a flow diagram of a design process used in semiconductor design, manufacture, and/or test according to an embodiment of the present invention.

Before forming embedded oxide regions 410 and embedded semiconductor regions 610, it may be necessary to determine the desired amount of stress or strain to be applied to channel region 150. Where embedded semiconductor regions 610 are made of a silicon-germanium alloy, the amount of stress applied to channel region 150 may be proportional to the germanium content of embedded semiconductor regions 610. Because the lattice structure of a silicon-germanium alloy may be proportional to its germanium content, a person of ordinary skill in the art may select the desired lattice structure of embedded semiconductor regions 610 based on the desired amount of stress. In embodiments where the germanium content of embedded semiconductor regions 610 range from about 25% to about 50%, embedded semiconductor regions 610 may have lattice constants of about 5.45 Å to about 5.55 Å. Similarly, where embedded semiconductor regions 610 are made of a silicon-carbon alloy, the amount of stress applied to channel region 150 may be proportional to the carbon content of embedded semiconductor regions 610. As the lattice structure of a silicon-carbon alloy may also be proportional to its carbon content, a person of ordinary skill in the art may determine the desired lattice constants of embedded semiconductor regions 610 based on the desired amount of stress. In embodiments where the carbon content of embedded semiconductor regions 610 range from about 0.5% to about 2%, embedded semiconductor regions 610 may have lattice constants of about 5.35 Å to about 5.4 Å. Embedded oxide regions 410 may have a substantially similar lattice structure as embedded semiconductor regions 610 (FIG. 7). The process for matching the lattice constant of a rare earth oxide layer to a silicon germanium layer is known in the art. In one embodiment, embedded oxide regions 410 may be epitaxially grown using methods known in the art such as, for example, electron beam evaporation, molecular beam evaporation, or chemical vapor deposition.

Collectively, embedded oxide regions 410 and embedded semiconductor regions 610 form bi-layer source/drains on each side of channel region 150. As embedded oxide regions 410 may have a thickness of about 70 nm to 95 nm and embedded semiconductor regions 610 may have a thickness of about 5 nm to about 10 nm below the top surface of substrate 100, the bi-layer source/drains may include embedded oxide regions 410 having a thickness of about 87.5% to about 95% of the bi-layer source/drain thickness and embedded semiconductor regions 610 having a thickness of about 5% to about 12.5% of the bi-layer source/drain thickness. Because embedded oxide regions 410 and embedded semiconductor regions 610 have substantially similar lattice structures, embedded oxide regions 410 will stretch or compress the channel region 150 to a substantially equivalent degree as if embedded oxide regions 410 were composed of the same material as embedded semiconductor regions 610. However, because embedded oxide regions 410 are composed of an insulating material, it does not provide a path for parasitic current below channel 150. Therefore, by filling source/drain recesses 310 with bi-layer stacks including embedded oxide regions 410 and embedded semiconductor regions 610 where embedded oxide regions 410 and embedded semiconductor regions 610 have substantially similar lattice structures, it may be possible for the bi-layer stack of embedded oxide regions 410 and embedded semiconductor regions 610 to have equivalent strain benefits as a single silicon-germanium or silicon-carbon layer while avoiding issues associated with punchthrough.

After formation of embedded semiconductor regions 610, ion implantation processes may be performed (not shown) to introduce dopants into the channel region 150 or other regions of the substrate 100. A person of ordinary skill in the art will understand that doping processes may also be performed during other steps of the fabrication described above. After formation of embedded semiconductor regions 610, processes associated with contact formation (e.g., silicidation, interlevel dielectric (ILD) layer deposition, contact metal deposition) may be performed.

FIG. 7 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structure and/or device described above and shown in FIG. 6. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. In one embodiment, the design structure 920 comprises design data used in a design process and comprising information describing one or more embodiments of the invention with respect to the structure as shown in FIG. 6. The design data in the form of schematics or HDL, a hardware-description language (e.g., Verilog, VHDL, C, etc.) may be embodied on one or more machine readable media. For example, design structure 920 may be a text file, numerical data or a graphical representation of the one or more embodiments of the invention, as shown in FIG. 6. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as that shown FIG. 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIG. 6 to generate a netlist 980 which may contain a design structure such as design structure 920.

Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 6. In one embodiment, design structure 990 may comprise a compiled, executable HDL simulation model that functionally simulates the device shown in FIG. 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce the device or structure as described above and shown in FIG. 6. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
 a substrate;
 a channel region in the substrate; and
 a bi-layer source/drain region including an embedded oxide region in the substrate and an embedded semiconductor region above the embedded oxide region
 wherein the embedded oxide region comprises cadmium oxide, yttrium oxide, scandium oxide, cerium oxide, lanthanum oxide, praseodymium oxide, thorium oxide, or actinium oxide.

2. The structure of claim 1, wherein the embedded oxide region comprises an epitaxial oxide.

3. The structure of claim 1, wherein the embedded oxide region has approximately the same lattice constant as the embedded semiconductor region.

4. The structure of claim 1, wherein the embedded semiconductor region has a thickness within the substrate of about 5 nm to about 10 nm.

5. The structure of claim 1, wherein the thickness of the embedded semiconductor region comprises about 5% to about 12.5% of the thickness of the source/drain region.

6. The structure of claim 1, wherein the embedded oxide region has a thickness of about 70 nm to about 95 nm.

7. The structure of claim 1, wherein the thickness of the embedded oxide region comprises about 87.5% to about 95% of the thickness of the source/drain region.

8. The structure of claim 1, wherein a top surface of the source/drain region is above a top surface of the substrate.

9. The structure of claim 1, wherein the embedded semiconductor region comprises a silicon-germanium alloy or a silicon-carbon alloy.

10. The structure of claim 1, further comprising:
 a gate on the semiconductor substrate above the channel region; and a spacer on a sidewall of the gate, wherein the spacer laterally offsets the source/drain region from the gate.

11. A method of forming a transistor structure, the method comprising:
etching a source/drain recess in a semiconductor substrate;
forming an embedded oxide region in a portion of the source/drain recess; and
forming an embedded semiconductor region in the source/drain recess above the embedded oxide region,
wherein forming an embedded oxide region in the portion of the source/drain recess comprises growing an epitaxial oxide in a bottom portion of the source/drain recess;
wherein the epitaxial oxide is a rare-earth oxide selected from the group consisting of cadmium oxide, yttrium oxide, scandium oxide, cerium oxide, lanthanum oxide, praseodymium oxide, thorium oxide, and actinium oxide.

12. The method of claim 11, wherein forming an embedded semiconductor region above the embedded oxide region comprises epitaxially growing a silicon-germanium alloy or a silicon-carbon alloy on the embedded oxide region.

13. The method of claim 11, further comprising forming a spacer on a sidewall of a gate, wherein the source/drain recess is laterally offset from the gate by the spacer.

14. A method of forming a source/drain region, the method comprising:
selecting a desired amount of stress to be applied by the source/drain region;
selecting a semiconductor material that will apply the desired amount of stress when formed in the source/drain region;
selecting a oxide with a similar lattice constant as the semiconductor material;
forming a source/drain recess having a top portion and a bottom portion in a substrate;
forming the oxide in the bottom portion of the source/drain recess; and
forming the semiconductor material on the oxide at least partially in the top portion of the source/drain recess,
wherein the oxide comprises a rare-earth oxide selected from the group consisting of cadmium oxide, yttrium oxide, scandium oxide, cerium oxide, lanthanum oxide, praseodymium oxide, thorium oxide, and actinium oxide.

15. The method of claim 14, wherein the semiconductor material is a silicon-germanium alloy or a silicon-carbon alloy.

16. The method of claim 15 wherein the semiconductor material comprises a silicon-germanium alloy with a germanium concentration of about 25% to about 50%.

17. The method of claim 15, wherein the semiconductor material comprises a silicon-carbon alloy with a carbon concentration of about 0.5% to about 2%.

* * * * *